US012562328B2

(12) United States Patent

Mccue et al.

(10) Patent No.: US 12,562,328 B2
(45) Date of Patent: Feb. 24, 2026

(54) CONTACTLESS SWITCH FOR A LAWNMOWER

(71) Applicant: MILWAUKEE ELECTRIC TOOL CORPORATION, Brookfield, WI (US)

(72) Inventors: Shane Mccue, Greenfield, WI (US); Adam A. Ostrowski, Milwaukee, WI (US); Maxwell L. Merget, Milwaukee, WI (US); Jacob P. Schneider, Cedarburg, WI (US); Tyler L Graham, Milwaukee, WI (US); Caleb N. Hille, West Chester, OH (US); GuoPeng Chen, Dongguan (CN); XiaoBing Guo, Puyang (CN); Manyi Zhou, Dongguan (CN); Zhiyong Zhou, Zhuzhou (CN); Haineng Ye, Kuanghe Town (CN)

(73) Assignee: Milwaukee Electric Tool Corporation, Brookfield, WI (US)

( * ) Notice: Subject to any disclaimer, the term of this patent is extended or adjusted under 35 U.S.C. 154(b) by 1067 days.

(21) Appl. No.: 17/584,823

(22) Filed: Jan. 26, 2022

(65) Prior Publication Data

US 2022/0254587 A1      Aug. 11, 2022

(30) Foreign Application Priority Data

Feb. 5, 2021    (CN) .......................... 202110163605.2

(51) Int. Cl.
*H01H 36/00* (2006.01)
*A01D 34/00* (2006.01)
(Continued)

(52) U.S. Cl.
CPC ........... *H01H 36/00* (2013.01); *A01D 34/006* (2013.01); *A01D 34/6806* (2013.01);
(Continued)

(58) Field of Classification Search
CPC .. A01D 34/006; A01D 34/69; A01D 34/6806; A01D 34/824; A01D 34/64;
(Continued)

(56) References Cited

U.S. PATENT DOCUMENTS 4,820,962 A    4/1989   Millauer
4,830,549 A    5/1989   Neumaier et al.
(Continued)

FOREIGN PATENT DOCUMENTS

CN        103534067 A    1/2014
CN        104541737 A    4/2015
(Continued)

OTHER PUBLICATIONS

Chinese Patent Office Action for Application No. 202110163605.2 dated Sep. 21, 2023 (10 pages including machine English translation).

(Continued)

*Primary Examiner* — Joseph M Rocca
*Assistant Examiner* — Robert E Pezzuto
(74) *Attorney, Agent, or Firm* — Dority & Manning, P.A.

(57) ABSTRACT

A lawnmower comprising a housing, one or more cutting blades, and a motor configured to rotate the one or more cutting blades. The lawnmower includes a handle including a switch assembly. The switch assembly includes a contactless switch pivotable about an axis point and a magnet located at the axis point. One or more paddles extend from the handle. The rotation of the one or more paddles causes the contactless switch to pivot about the axis point. The lawnmower includes a sensor configured to sense a variation of a magnetic field of the magnet, and a controller coupled to the motor and the sensor. The controller is configured to receive, from the sensor, a value associated with the variation of the magnetic field of the magnet, and control the (Continued)

motor based on the value of the variation of the magnetic field.

20 Claims, 18 Drawing Sheets

(51) Int. Cl.

| | |
|---|---|
| A01D 34/68 | (2006.01) |
| A01D 34/69 | (2006.01) |
| A01D 34/78 | (2006.01) |
| A01D 34/82 | (2006.01) |
| H01H 9/02 | (2006.01) |
| H05K 7/14 | (2006.01) |
| A01D 101/00 | (2006.01) |

(52) U.S. Cl.
CPC ............. *A01D 34/69* (2013.01); *A01D 34/78* (2013.01); *A01D 34/824* (2013.01); *H01H 9/02* (2013.01); *H05K 7/1427* (2013.01); *A01D 2034/6843* (2013.01); *A01D 2101/00* (2013.01)

(58) Field of Classification Search
CPC .......... A01D 69/02; H01H 36/00; H01H 9/02; H05K 7/1427; G01D 5/06; G01D 5/145; G01D 5/14; B25F 5/02
See application file for complete search history.

(56) References Cited

U.S. PATENT DOCUMENTS

| | | | |
|---|---|---|---|
| 5,235,261 A | 8/1993 | Philipp | |
| 5,365,155 A | 11/1994 | Zimmermann | |
| 5,847,908 A | 12/1998 | Herbstritt | |
| 6,658,829 B2 | 12/2003 | Kobayashi et al. | |
| 6,891,457 B2 | 5/2005 | Sako | |
| 6,933,689 B2 | 8/2005 | Yamamoto | |
| 7,053,567 B2 | 5/2006 | Yamamoto | |
| 7,076,830 B2 | 7/2006 | Conner et al. | |
| 7,090,030 B2 | 8/2006 | Miller | |
| 7,174,972 B2 | 2/2007 | Kristen et al. | |
| 7,210,541 B2 | 5/2007 | Miller | |
| 7,242,390 B2 | 7/2007 | Bader et al. | |
| 7,359,628 B2 | 4/2008 | Broghammer et al. | |
| 7,411,144 B2 | 8/2008 | Broghammer | |
| 7,732,747 B2 | 6/2010 | Wieler et al. | |
| 7,868,263 B2 | 1/2011 | Hammerstingl et al. | |
| 8,011,441 B2 | 9/2011 | Leimbach et al. | |
| 8,011,547 B2 | 9/2011 | Leimbach et al. | |
| 8,210,273 B2 | 7/2012 | Suzuki et al. | |
| 8,230,941 B2 | 7/2012 | Leimbach et al. | |
| 8,261,642 B2 | 9/2012 | Brandstrom et al. | |
| 8,267,296 B2 | 9/2012 | Leimbach et al. | |
| 8,267,297 B2 | 9/2012 | Leimbach et al. | |
| 8,286,722 B2 | 10/2012 | Leimbach et al. | |
| 8,387,718 B2 | 3/2013 | Leimbach et al. | |
| 8,587,230 B2 | 11/2013 | Pant et al. | |
| 8,587,231 B2 | 11/2013 | Pant | |
| 8,602,282 B2 | 12/2013 | Leimbach et al. | |
| 8,616,300 B2 | 12/2013 | Suzuki et al. | |
| 8,636,079 B2 | 1/2014 | Totsu | |
| 8,657,032 B2 | 2/2014 | Numata | |
| 8,689,901 B2 | 4/2014 | Chen | |
| 8,763,874 B2 | 7/2014 | McCardle et al. | |
| 8,810,085 B2 | 8/2014 | Matsunaga et al. | |
| 8,813,370 B2 | 8/2014 | Pellenc | |
| 8,833,221 B2 | 9/2014 | Tomita et al. | |
| 8,833,234 B2 | 9/2014 | Gronau et al. | |
| 8,856,555 B2 | 10/2014 | Teydron et al. | |
| 8,875,804 B2 | 11/2014 | Puzio et al. | |
| 8,995,907 B2 | 3/2015 | Joseph | |

| | | | |
|---|---|---|---|
| 9,415,488 B2 | 8/2016 | Puzio et al. | |
| 9,450,471 B2 | 9/2016 | Mergener et al. | |
| 9,451,976 B2 | 9/2016 | Schneider et al. | |
| 9,563,219 B2 | 2/2017 | Heydron et al. | |
| 9,654,050 B2 | 5/2017 | Kokinelis et al. | |
| 9,676,088 B2 | 6/2017 | Leimbach et al. | |
| 9,706,706 B2 | 7/2017 | Barendrecht | |
| 9,774,229 B1 | 9/2017 | Mergener et al. | |
| 9,954,417 B2 | 4/2018 | Mergener et al. | |
| 9,960,656 B2 | 5/2018 | Mergener et al. | |
| 10,240,881 B1 | 3/2019 | Galie et al. | |
| 10,414,436 B1 | 9/2019 | Bonny | |
| 11,172,604 B2 | 11/2021 | Yang et al. | |
| 11,787,471 B1* | 10/2023 | Probst ................... | B62D 11/04 56/10.8 |
| 2004/0206519 A1 | 10/2004 | Kristen et al. | |
| 2007/0144753 A1 | 6/2007 | Miller | |
| 2008/0053805 A1 | 3/2008 | Wanek | |
| 2009/0173510 A1 | 7/2009 | Milbourne et al. | |
| 2009/0308628 A1 | 12/2009 | Totsu | |
| 2010/0326804 A1 | 12/2010 | Saur | |
| 2011/0291777 A1 | 12/2011 | Stiltz et al. | |
| 2012/0162847 A1 | 6/2012 | Suzuki et al. | |
| 2012/0312573 A1 | 12/2012 | Yanagihara | |
| 2013/0046448 A1 | 2/2013 | Fan et al. | |
| 2013/0256274 A1 | 10/2013 | Faulkner | |
| 2013/0292147 A1 | 11/2013 | Mergener et al. | |
| 2014/0008090 A1 | 1/2014 | Kokinelis et al. | |
| 2014/0047913 A1 | 2/2014 | Waite et al. | |
| 2014/0100687 A1 | 4/2014 | Ekstrom et al. | |
| 2014/0321930 A1 | 10/2014 | Dengler et al. | |
| 2015/0097641 A1 | 4/2015 | Chen | |
| 2016/0012994 A1 | 1/2016 | Boffelli et al. | |
| 2016/0081267 A1 | 3/2016 | Barendrecht | |
| 2016/0221085 A1 | 8/2016 | Zhong et al. | |
| 2016/0359392 A1 | 12/2016 | Mergener et al. | |
| 2017/0165824 A1 | 6/2017 | Takeda | |
| 2017/0266796 A1 | 9/2017 | Leimbach et al. | |
| 2018/0082805 A1 | 3/2018 | Fangmann | |
| 2018/0082808 A1 | 3/2018 | Fangmann | |
| 2018/0091145 A1 | 3/2018 | Dey, IV et al. | |
| 2018/0248446 A1 | 8/2018 | Mergener et al. | |
| 2019/0299795 A1 | 10/2019 | Yan et al. | |
| 2020/0043684 A1 | 2/2020 | Olsson et al. | |
| 2020/0245555 A1 | 8/2020 | Colber et al. | |
| 2020/0390031 A1* | 12/2020 | Yang ..................... | G05G 9/047 |
| 2021/0243946 A1 | 8/2021 | Yang et al. | |
| 2022/0134532 A1 | 5/2022 | Merget et al. | |

FOREIGN PATENT DOCUMENTS

| | | | |
|---|---|---|---|
| CN | 106997821 A | 8/2017 | |
| CN | 111756280 A | 10/2020 | |
| DE | 9211412 U1 | 12/1992 | |
| DE | 19825433 A1 | 1/1999 | |
| DE | 19953204 A1 | 5/2001 | |
| DE | 102007043035 A1 | 3/2009 | |
| DE | 102013212573 A1 | 12/2014 | |
| EP | 1788597 B1 | 12/2008 | |
| EP | 2110830 A2 | 10/2009 | |
| EP | 2682235 A2 | 1/2014 | |
| EP | 2395527 B1 | 3/2015 | |
| EP | 2946710 B1 | 8/2017 | |
| EP | 3545744 A1 | 10/2019 | |
| JP | 2006120466 A | 5/2006 | |
| KR | 1020100080198 A | 7/2010 | |
| WO | 2011151147 A1 | 12/2011 | |
| WO | 2014031539 A1 | 2/2014 | |

OTHER PUBLICATIONS

Extended European Search Report for Application No. 22154831.6 dated Jun. 24, 2022 (8 pages).

* cited by examiner

400

ACTUATE AN INPUT MECHANISM — 405

ROTATE MAGNET — 410

SENSE VARIATION IN MAGNETIC FIELD — 415

CONVERT SENSED MAGNETIC FIELD TO OUTPUT SIGNAL — 420

CONTROL OUTPUT OF THE LAWN MOWER BASED ON THE OUTPUT SIGNAL — 425

CONTACTLESS SWITCH FOR A LAWNMOWER

RELATED APPLICATIONS

This application claims the benefit of Chinese Patent Application No. CN 202110163605.2, filed on Feb. 5, 2021, the entire content of which is hereby incorporated by reference.

SUMMARY

Embodiments described herein relate to a contactless switch or trigger, and more specifically, a contactless switch or trigger for a lawnmower.

Input devices, such as a switch or trigger on a power tool, may be physically coupled to one or more electronic components, such as variable resistors, relays, and the like. Physical connections on input devices, including switches or triggers, may wear over time, thereby reducing the operational life of the tool. Thus, it would be advantageous to utilize contactless sensing device to reduce wear and increase life of the input devices and/or the power tool.

Lawnmower described herein include a housing, one or more blades, and a motor configured to rotate the one or more blades. The lawnmower includes a handle including a switch assembly. The switch assembly includes a contactless switch pivotable about an axis point, and a magnet located at the axis point. One or more paddles extend from the handle. Rotation of the one or more paddles causes the contactless switch to pivot about the axis point. The lawnmower includes a sensor configured to sense a variation of a magnetic field of the magnet, and a controller coupled to the motor and the sensor. The controller is configured to receive, from the sensor, a value associated with the variation of the magnetic field of the magnet (e.g., as the magnet rotates), and control the motor based on the value of the variation of the magnetic field.

Methods described herein for driving a lawnmower include detecting, with a sensor, a variation in a magnetic field from a rotation of a magnet. The rotation of the magnet is in response to pivoting of a contactless switch about an axis point. The magnet is located at the axis point. The methods also include converting, with the sensor, the variation in the magnetic field to an output signal, providing, with the sensor, the output signal to a controller, and controlling, with the controller, a motor of the lawnmower based on the output signal to rotate one or more cutting blades.

Contactless switch assemblies for a lawnmower described herein include an upper housing, a lower housing configured to couple to the upper housing to form a switch assembly housing, and a contactless switch pivotable about an axis point. The contactless switch is external to the switch assembly housing. The contactless switch assemblies further include one or more paddles coupled to the contactless switch. The one or more paddles is configured to be rotated to pivot the contactless switch about the axis point. The contactless switch assemblies further include a magnet located at the axis point. The magnet is configured to be rotated when the one or more paddles is rotated to pivot the contactless switch about the axis point. The contactless switch assemblies further include a sensor configured to sense a variation of a magnetic field of the magnet.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software-based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

It should be understood that although certain drawings illustrate hardware and software located within particular devices, these depictions are for illustrative purposes only. Functionality described herein as being performed by one component may be performed by multiple components in a distributed manner. Likewise, functionality performed by multiple components may be consolidated and performed by a single component. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links. Similarly, a component described as performing particular functionality may also perform additional functionality not described herein. For example, a device or structure that is "configured" in a certain way is configured in at least that way but may also be configured in ways that are not explicitly listed.

DETAILED DESCRIPTION

Figure 1:
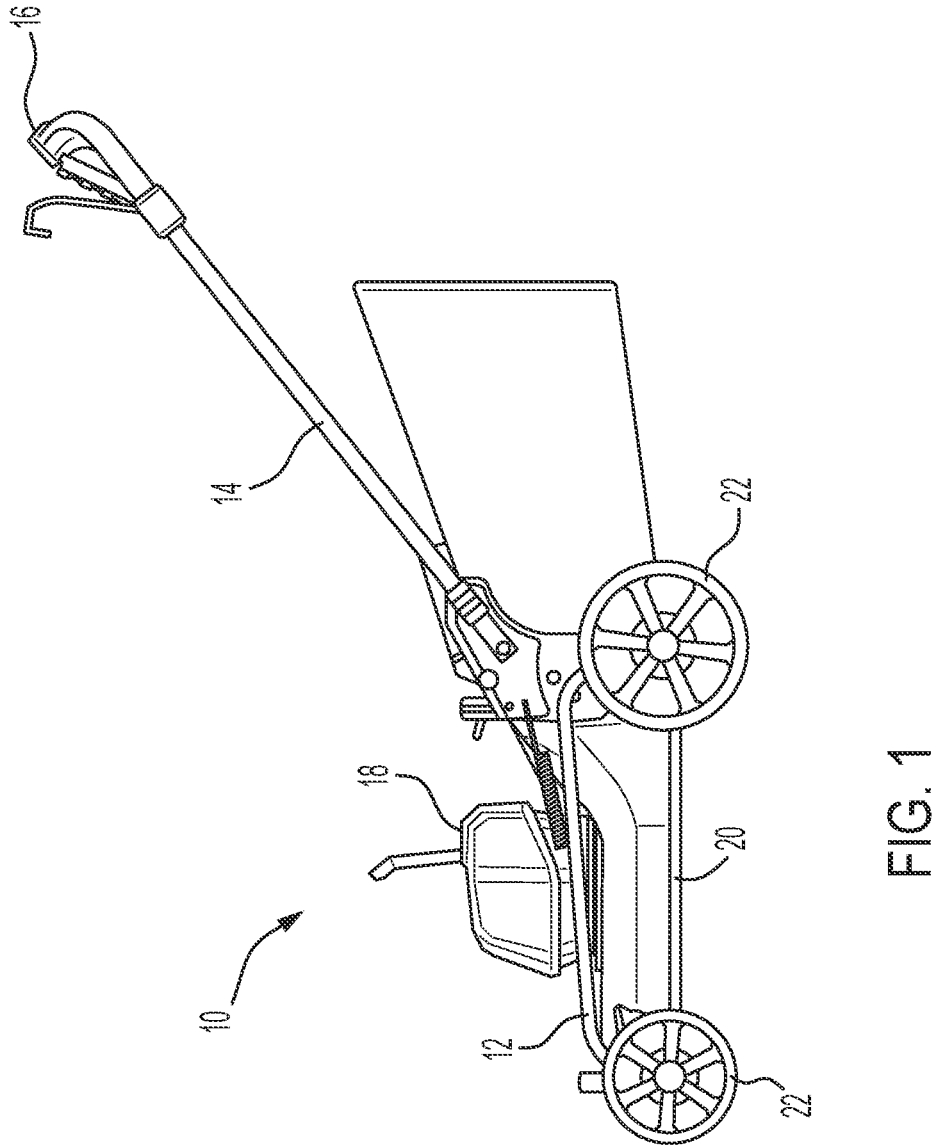
FIG. 1 is a lawnmower, according to some embodiments.

FIG. 1 illustrates a lawnmower 10, according to one embodiment. The lawnmower 10 includes a housing 12 (e.g., a lawnmower housing) and a handle 16 coupled to the housing 12 by support beams 14. A motor housing 18 is coupled to an upper portion of the housing 12 and houses a motor configured to drives cutting blades 20. The blades 20 are coupled to a lower portion of the housing 12. The lawnmower 10 includes a plurality of wheels 22 driven by the motor. In some embodiments, the plurality of wheels 22 are driven by an auxiliary motor within the motor housing 18.

Figure 2A:
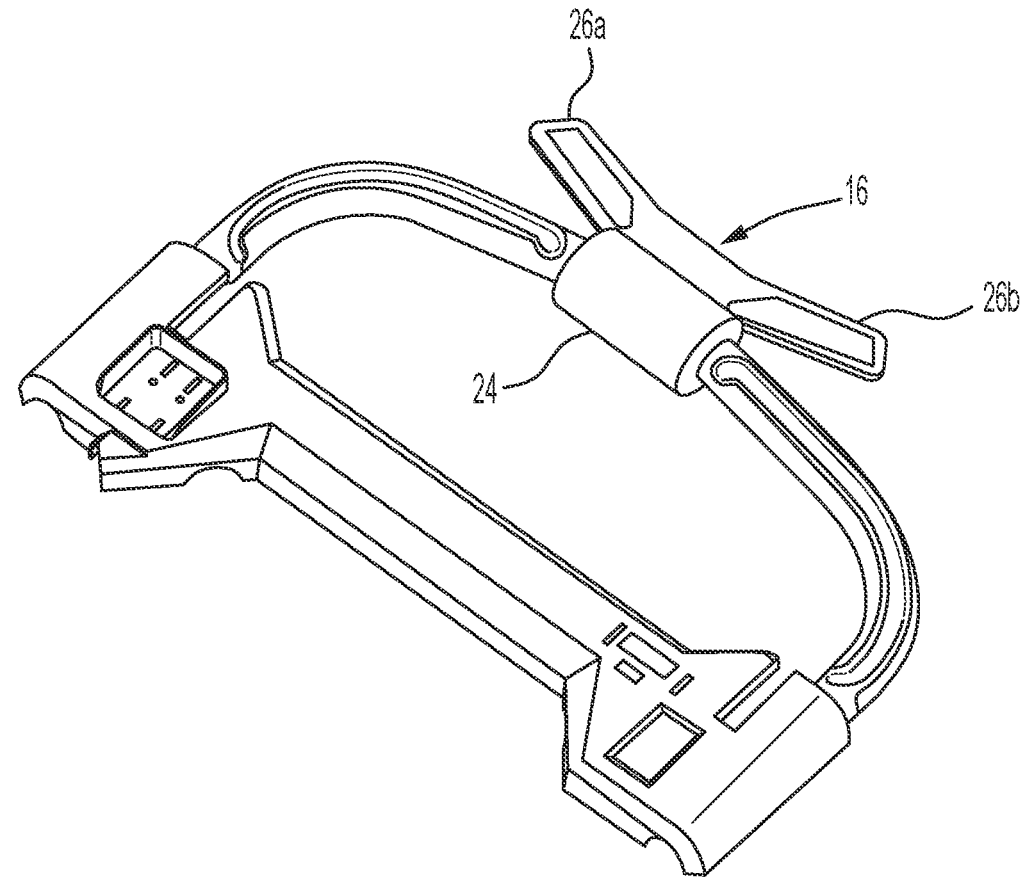
FIGS. 2A-2B are perspective views of a handle of the lawnmower of FIG. 1, according to some embodiments.
Figure 2B:
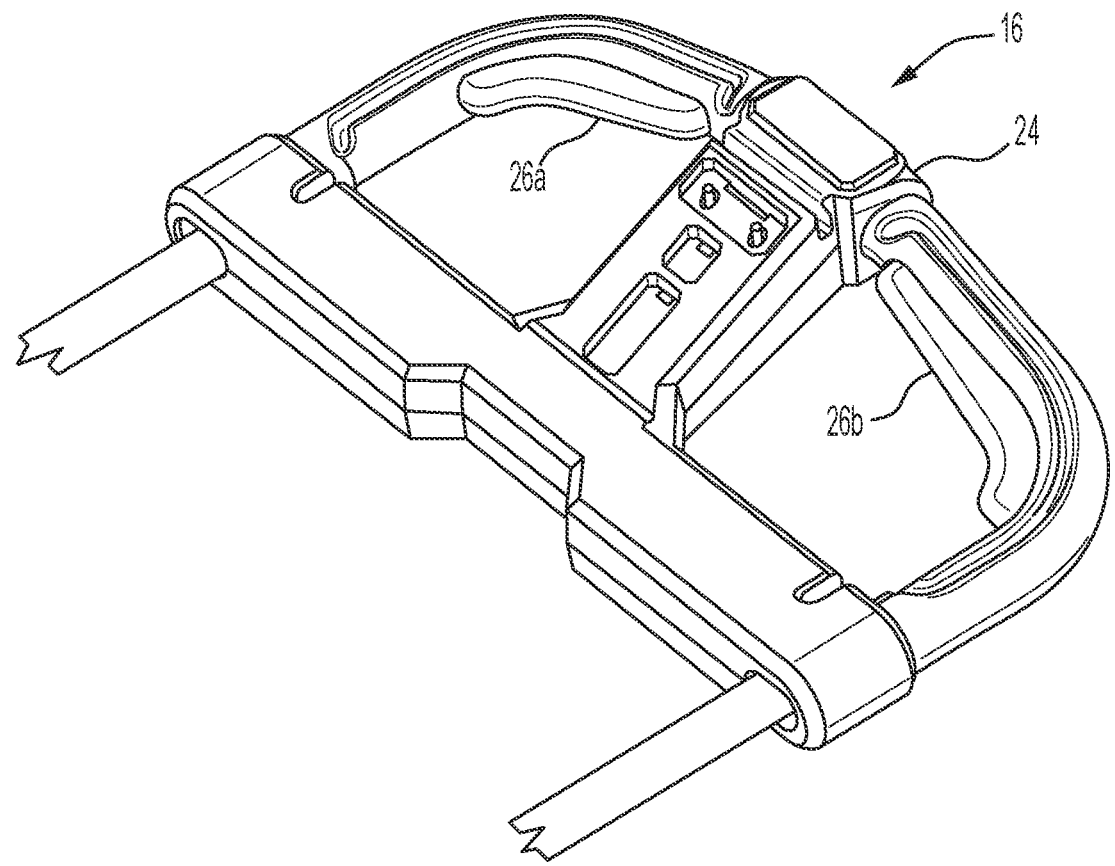
Figure 3A:
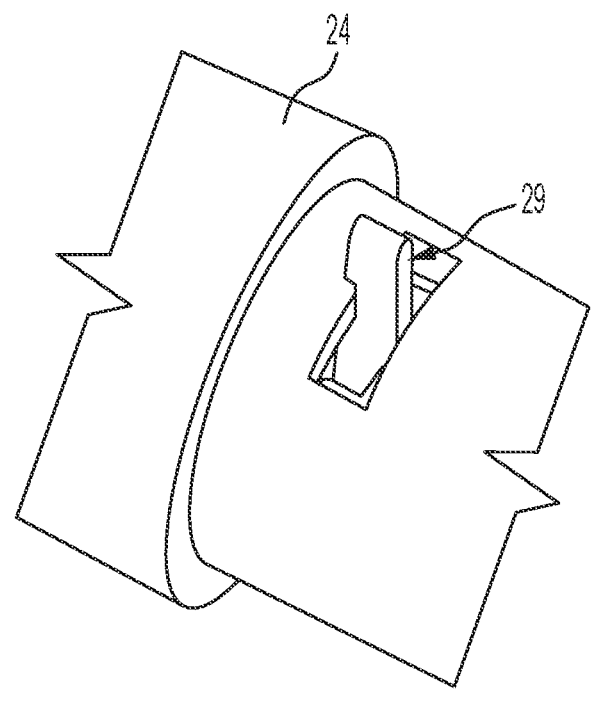
FIG. 3A is a perspective view of the handle of FIG. 2 with a portion of the housing removed to show a contactless switch assembly, according to some embodiments.

FIGS. 2A-2B illustrate the handle 16, according to some embodiments. The handle 16 includes a handle housing 24. A first paddle 26a and a second paddle 26b (e.g., paddles 26) extend from the handle housing 24 and act as a switch or trigger. Accordingly, operation of the first paddle 26a and the second paddle 26b may drive the motor and/or the auxiliary motor, as described in more detail below. A contactless switch assembly 29 is situated within the handle housing 24, as shown in FIG. 3A.

Figure 3B:
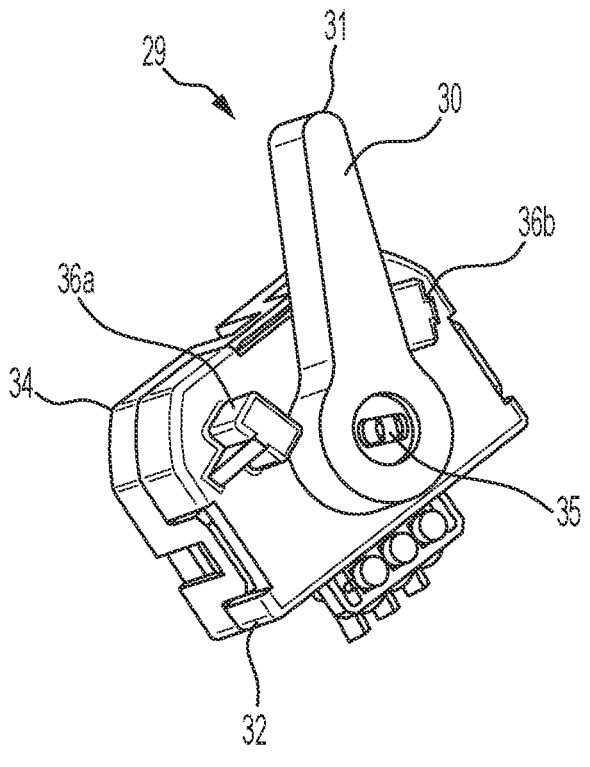
FIG. 3B is a perspective view of the contactless switch assembly of FIG. 3A, according to some embodiments.
Figure 4:
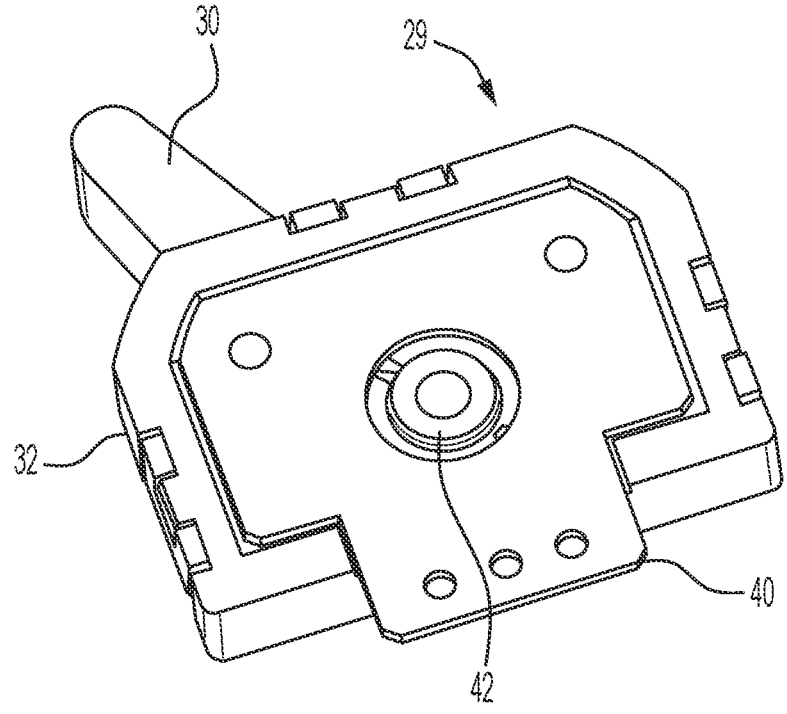
FIG. 4 is a perspective view of the contactless switch assembly of FIG. 3B with a lower housing removed, according to some embodiments.

FIG. 3B illustrates the contactless switch assembly 29 including a contactless switch 30, an upper housing 32, and a lower housing 34. The contactless switch 30 is external to the upper housing 32 and the lower housing 34. Having the contactless switch 30 external to the housing (i.e., upper housing 32 and lower housing 34 combined) helps prevent dust, water, and other particulates from getting into the housing. The contactless switch assembly 29 can also be made smaller as a result of having fewer components within the housing. As the paddles 26 are operated, the contactless switch 30 rotates about a pivot point 35. In some embodiments, the contactless switch 30 includes an upper portion 31 that contacts the paddles 26. Movement of the contactless switch 30 is bound by a first protrusion 36a and a second protrusion 36b. FIG. 4 provides a perspective view of the back of the contactless switch assembly 29 with the lower housing 34 removed. A printed circuit board (PCB) 40 is coupled to the upper housing 32. A magnet 42 is positioned in the center of the PCB 40 and is coupled to the contactless switch 30 such that rotation of the contactless switch 30 results in rotation of the magnet 42. The PCB 40 includes, for example, one or more Hall-effect sensors 50 (see FIG. 7B) in proximity to the magnet 42 for sensing changes in magnetic flux as the magnet 42 rotates. In some embodiments, the components of the PCB 40 are covered by a room temperature vulcanizing ("RTV") silicone or ultraviolet ("UV") glue to protect the components from dust, water, and other particulates.

Figure 5:
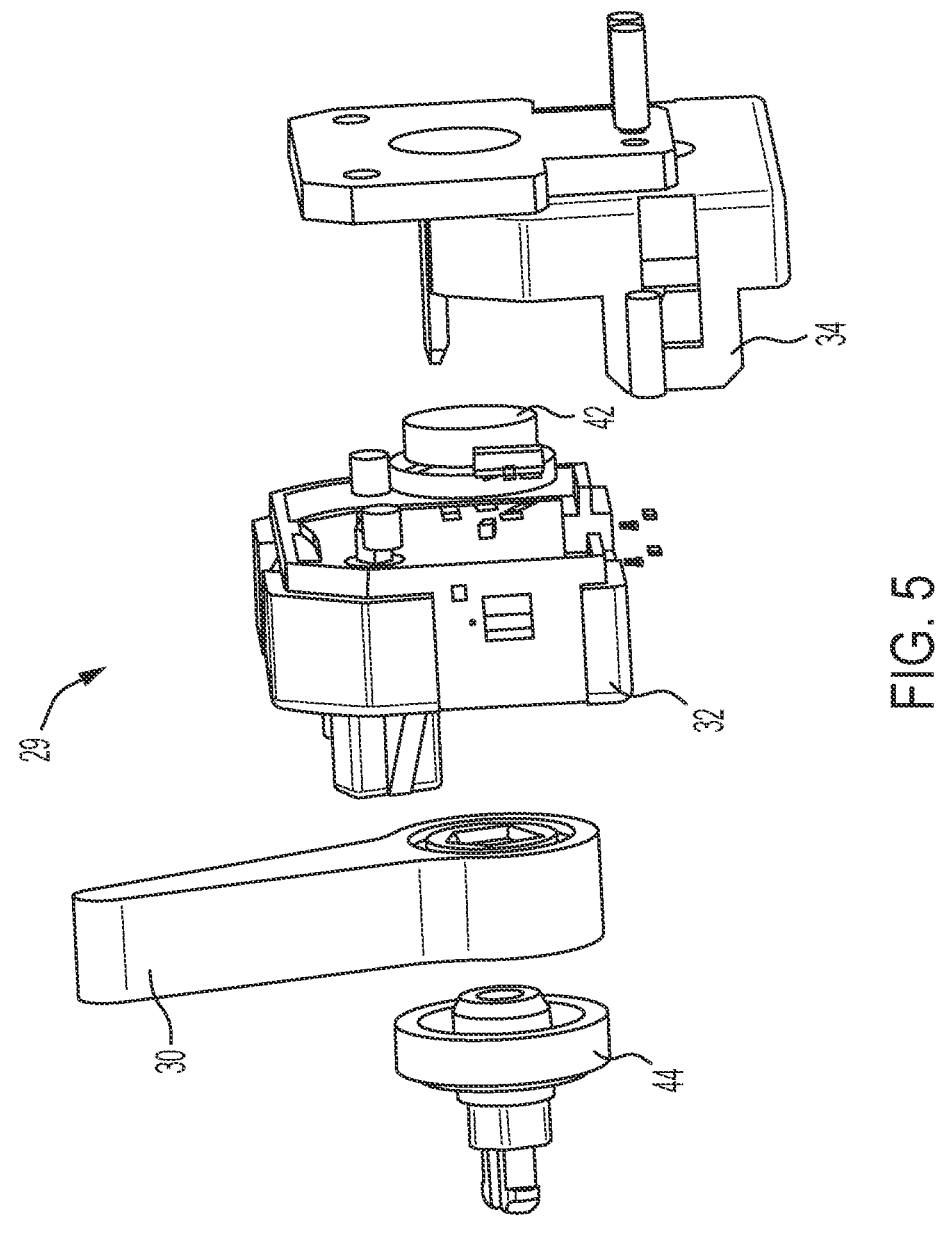
FIG. 5 is an exploded view of the contactless switch assembly of FIG. 3B, according to some embodiments.
Figure 6A:
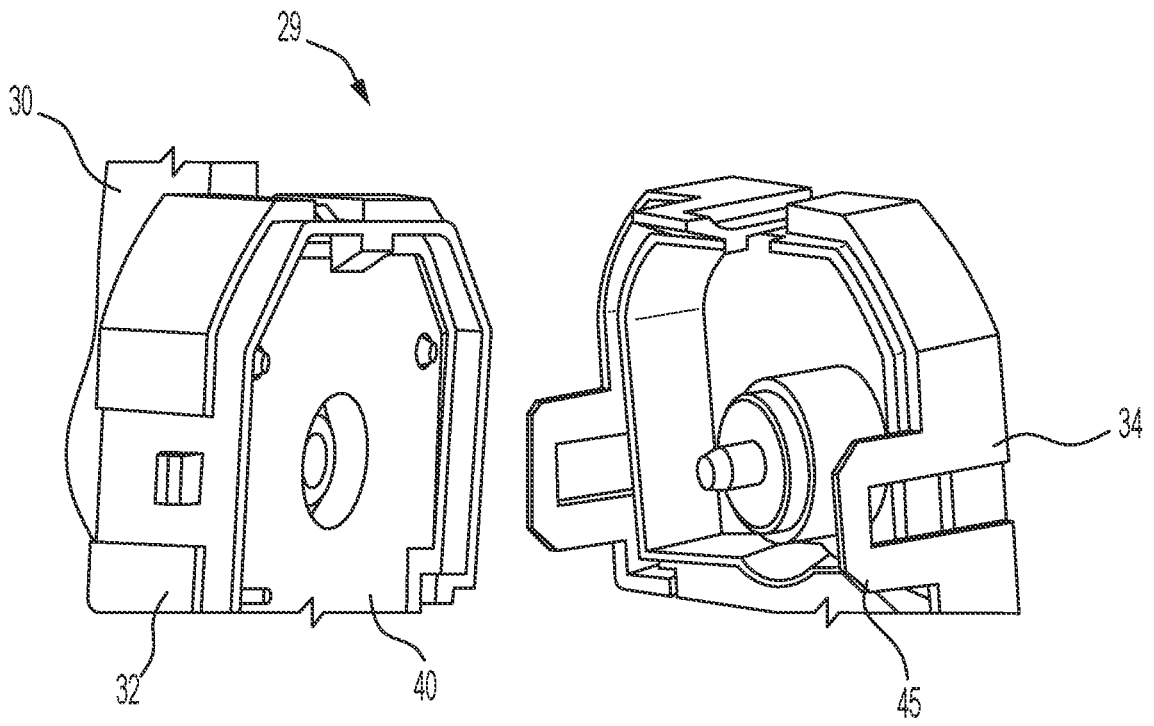
FIGS. 6A-6C are perspective views of the contactless switch assembly of FIG. 3B, according to some embodiments.
Figure 6C:
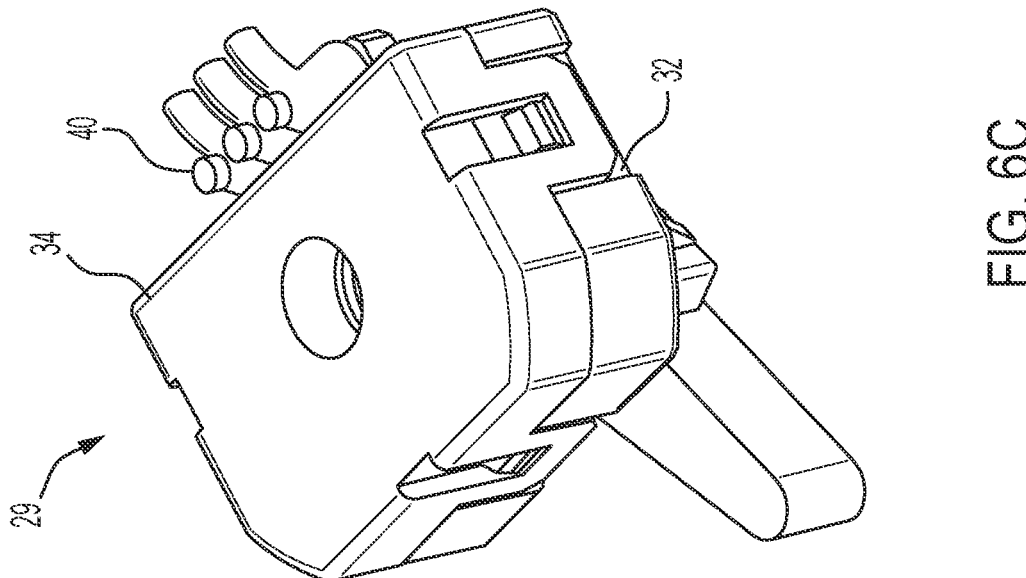
Figure 6B:
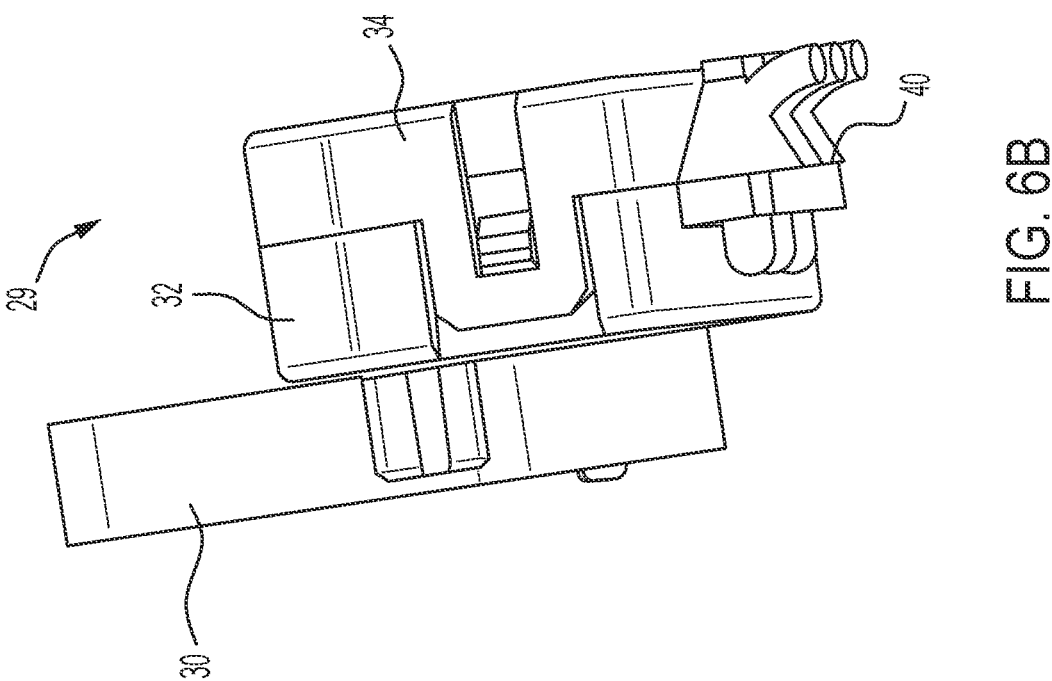

FIG. 5 illustrates an exploded view of the contactless switch assembly 29. The contactless switch 30 is coupled to the upper housing 32. The magnet 42 is placed within a rotator 44, which is coupled to the contactless switch 30 through the upper housing 32. The PCB 40 is situated near the magnet 42, rotator 44, and upper housing 32. In some embodiments, the magnet 42 includes positioning features for insert molding or press fitting. The lower housing 34 is situated over the PCB 40 and selectively couples to the upper housing 32 to form a switch assembly housing. As illustrated in FIG. 6A, the lower housing 34 couples to the upper housing 32 via clamps 45. FIG. 6B illustrates the contactless switch assembly 29 for an alternative perspective. As illustrated, the PCB 40 may extrude from the upper housing 32 and the lower housing 34 for making electrical connections to the PCB 40. FIG. 6C provides an additional perspective view of the contactless switch assembly 29.

Figure 7A:
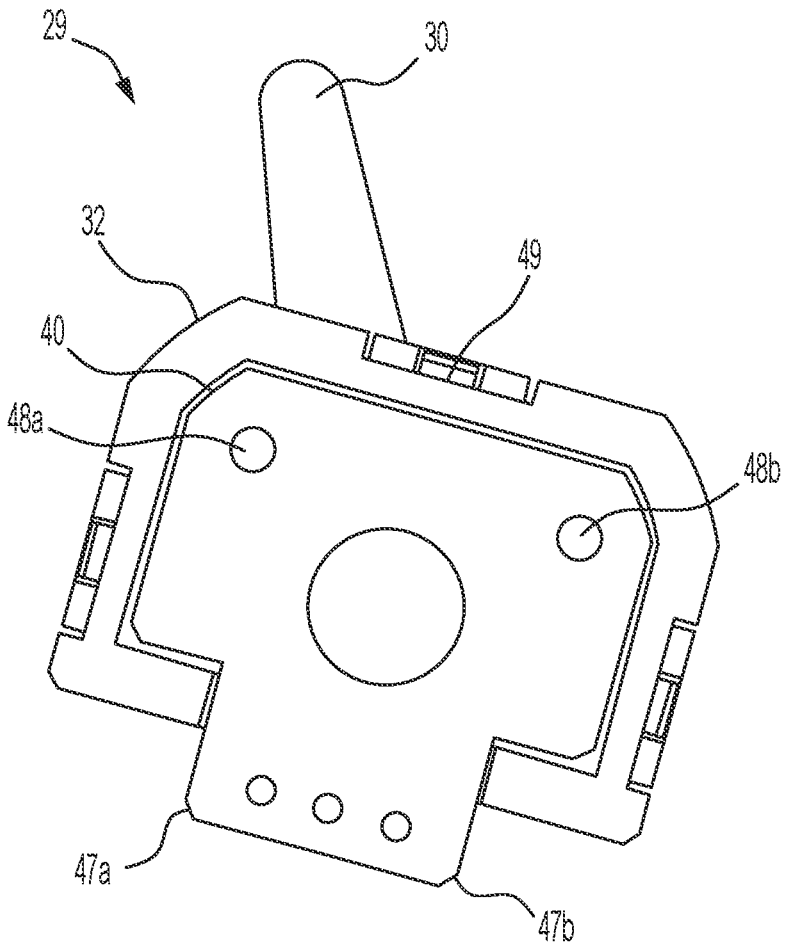
FIGS. 7A-7B are perspective views of the contactless switch assembly of FIG. 3B with a lower housing removed, according to some embodiments.
Figure 7B:
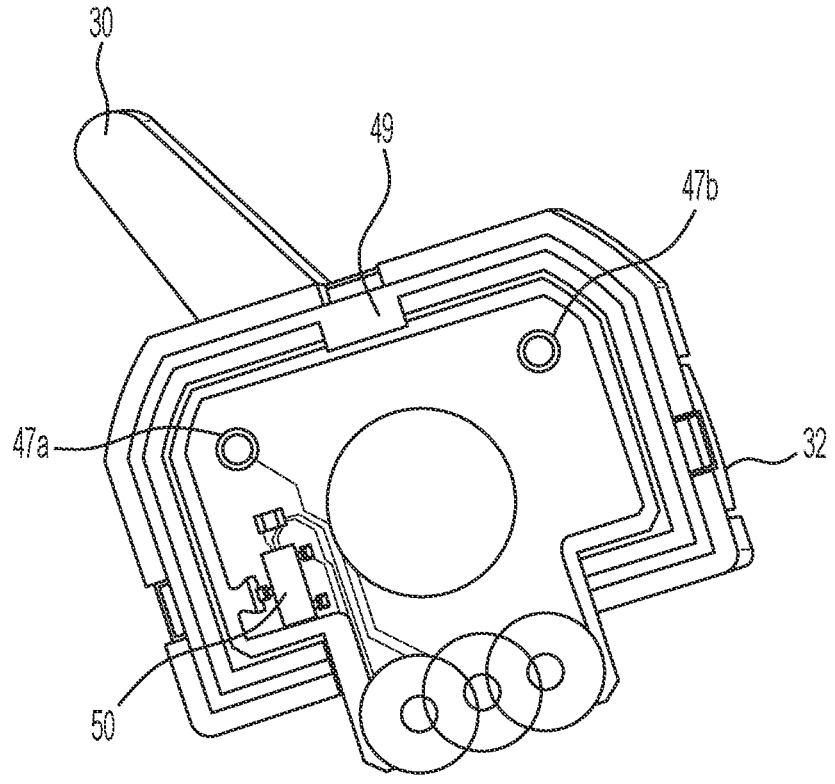
Figure 8:
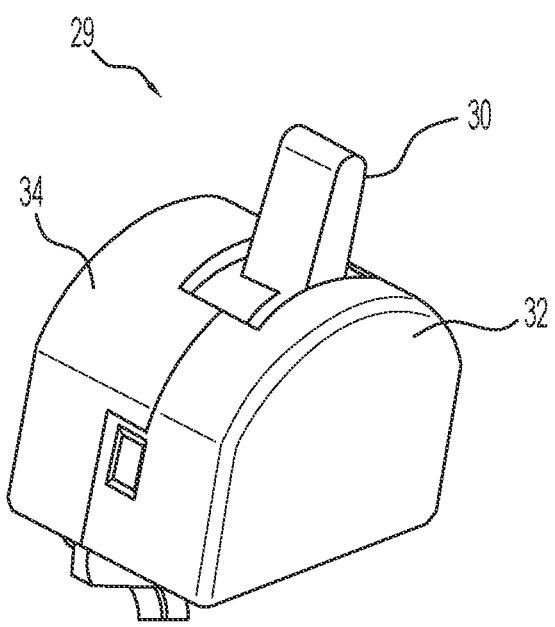
FIG. 8 is a perspective view of another embodiment of a contactless switch assembly, according to some embodiments.

FIGS. 7A-7B illustrate perspective views of the contactless switch assembly 29 with the lower housing 34 removed. The PCB 40 may couple to the upper housing 32 via a first pin 48a, a second pin 48b, and a snap assembly 49. Additionally, the PCB 40 may include a first corner 47a and a second corner 47b that are rounded corners.

Figure 9:
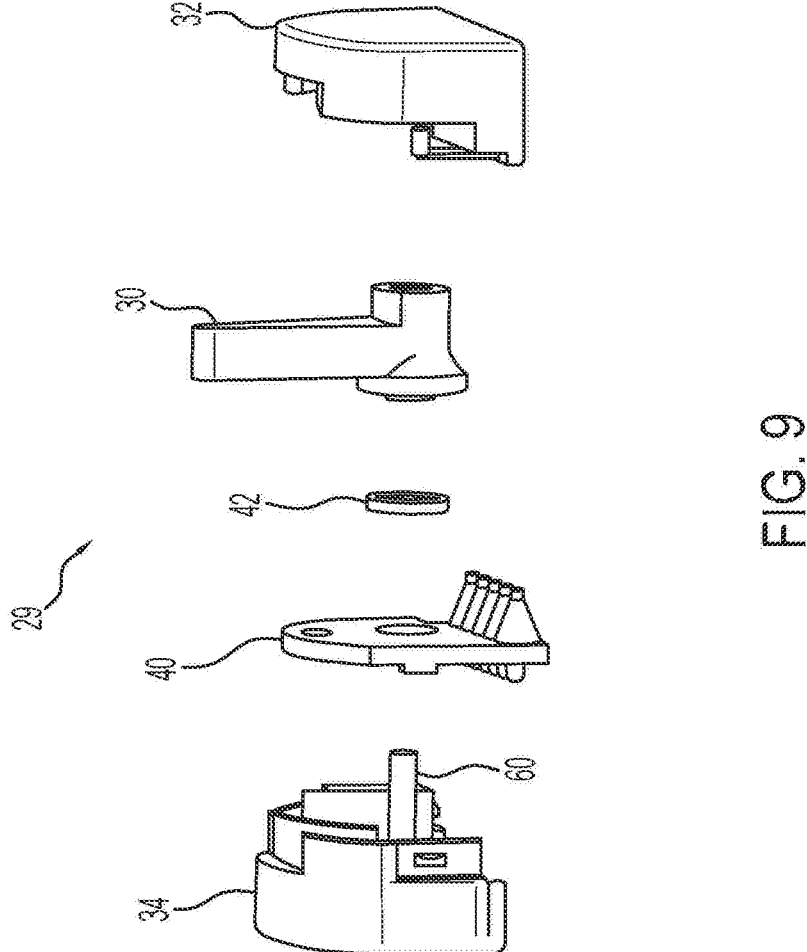
FIG. 9 is an exploded view of the contactless switch assembly of FIG. 8, according to some embodiments.
Figure 10:
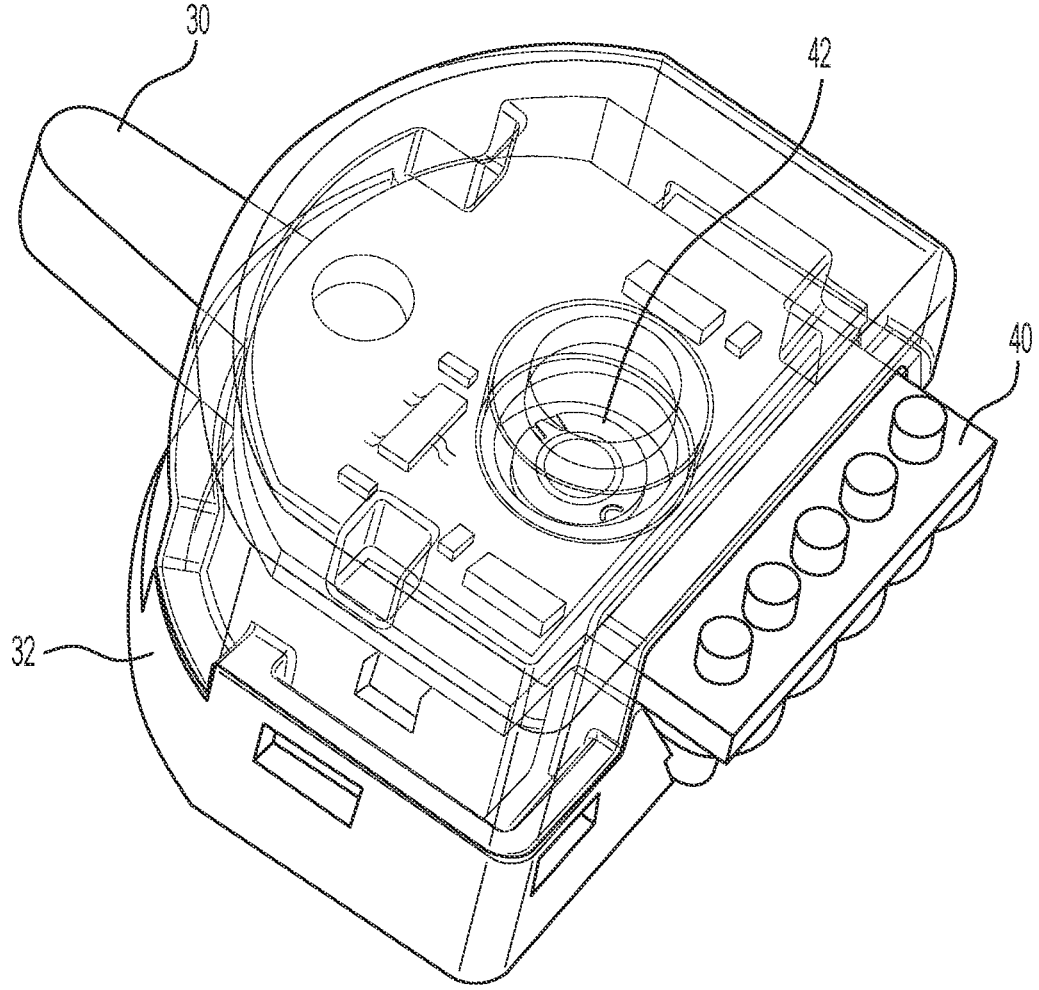
FIG. 10 is a perspective view of the contactless switch assembly of FIG. 8 with a lower housing removed, according to some embodiments.
Figure 11:
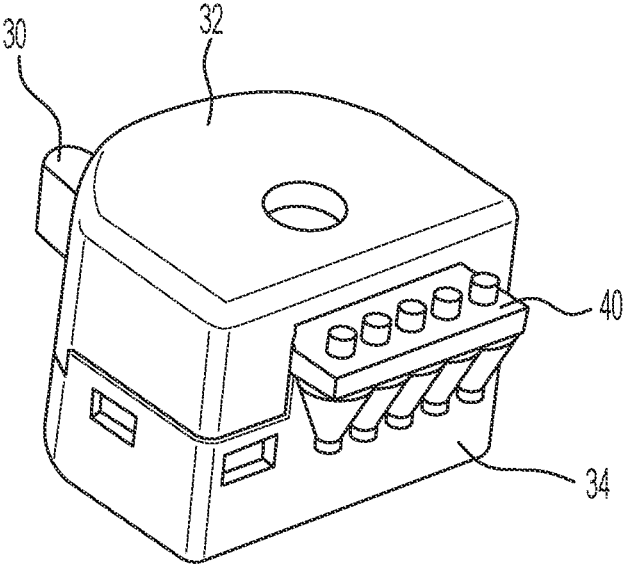
FIG. 11 is a perspective view of the contactless switch assembly of FIG. 8, according to some embodiments.

FIGS. 8-11 illustrate a variety of views of the contactless switch assembly 29 according to another embodiment. FIG. 9, for example, provides the PCB 40 coupled to the lower housing 34. The magnet 42 is coupled between the PCB 40 and the contactless switch 30 such that rotation of the contactless switch 30 results in rotation of the magnet 42. The upper housing 32 then couples to the lower housing 34. The lower housing 34 includes a pole 60 configured to hold the PCB 40, the magnet 42, and the contactless switch 30 in place. In the embodiment of FIGS. 8-11, the contactless switch 30 is internal to the combined upper housing 32 and lower housing 34.

Figure 12:
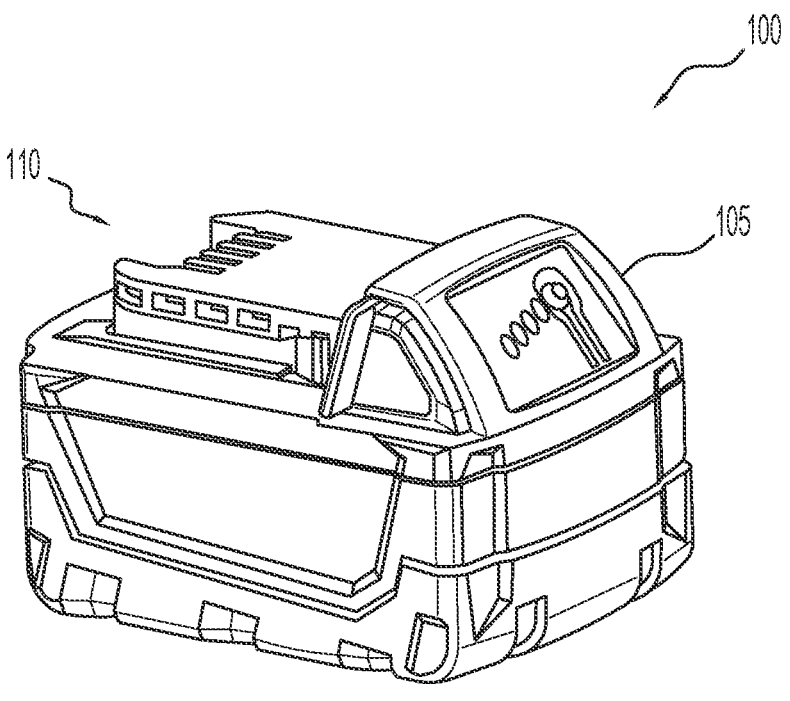
FIG. 12 is a perspective view of a battery pack, according to some embodiments.

In some embodiments, the lawnmower 10 is a battery-powered lawnmower. FIG. 12 illustrates a battery pack 100 that includes a housing 105 and an interface portion 110 for connecting the battery pack 100 to a device, such as the lawnmower 10.

Figure 13:
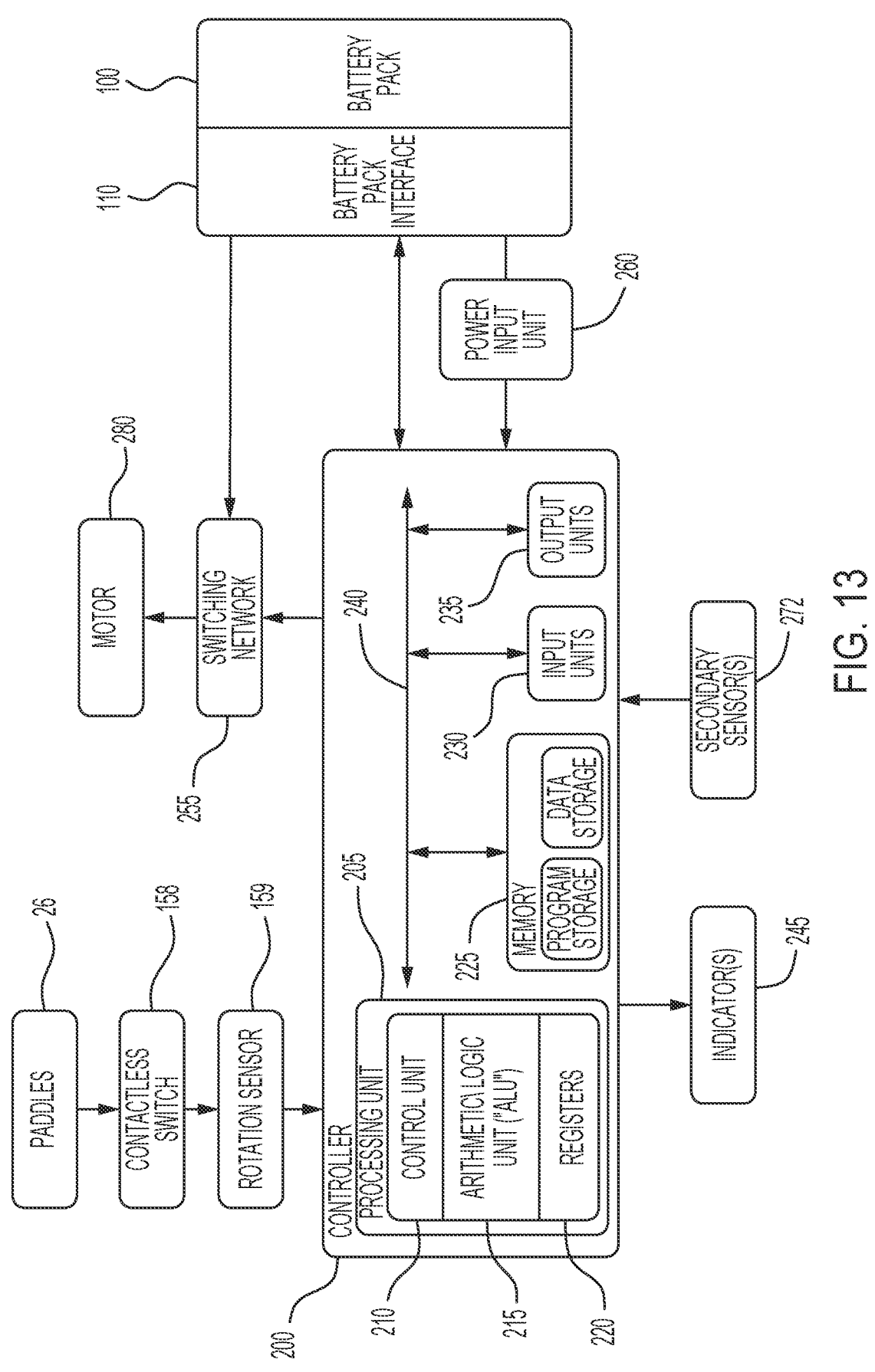
FIG. 13 is a block diagram of a control system for the lawnmower of FIG. 1, according to some embodiments.

A controller 200 for the lawnmower 10 is illustrated in FIG. 13. The controller 200 is electrically and/or communicatively connected to a variety of modules or components of the lawnmower 10. For example, the illustrated controller 200 is connected to indicators 245, secondary sensor(s) 272 (e.g., a speed sensor, a voltage sensor, a temperature sensor, a current sensor, etc.), the paddles 26 (via the contactless switch 30 and a rotation sensor 159), a power switching network 255, and a power input unit 260.

The controller 200 includes a plurality of electrical and electronic components that provide power, operational control, and protection to the components and modules within the controller 200 and/or lawnmower 10. For example, the controller 200 includes, among other things, a processing unit 205 (e.g., a microprocessor, an electronic processor, an electronic controller, a microcontroller, or another suitable programmable device), a memory 225, input units 230, and output units 235. The processing unit 205 includes, among other things, a control unit 210, an arithmetic logic unit ("ALU") 215, and a plurality of registers 220 (shown as a group of registers in FIG. 13), and is implemented using a known computer architecture (e.g., a modified Harvard architecture, a von Neumann architecture, etc.). The processing unit 205, the memory 225, the input units 230, and the output units 235, as well as the various modules connected to the controller 200 are connected by one or more control and/or data buses (e.g., common bus 240). The control and/or data buses are shown generally in FIG. 2 for illustrative purposes. The use of one or more control and/or data buses for the interconnection between and communication among the various modules and components would be known to a person skilled in the art in view of the embodiments described herein.

The memory 225 is a non-transitory computer readable medium and includes, for example, a program storage area and a data storage area. The program storage area and the data storage area can include combinations of different types of memory, such as a ROM, a RAM (e.g., DRAM, SDRAM, etc.), EEPROM, flash memory, a hard disk, an SD card, or other suitable magnetic, optical, physical, or electronic memory devices. The processing unit 205 is connected to the memory 225 and executes software instruction that are capable of being stored in a RAM of the memory 225 (e.g., during execution), a ROM of the memory 225 (e.g., on a generally permanent basis), or another non-transitory computer readable medium such as another memory or a disc. Software included in the implementation of the lawnmower 10 can be stored in the memory 225 of the controller 200. The software includes, for example, firmware, one or more applications, program data, filters, rules, one or more program modules, and other executable instructions. The controller 200 is configured to retrieve from the memory 225 and execute, among other things, instructions related to the control processes and methods described herein. In other embodiments, the controller 200 includes additional, fewer, or different components.

The controller 200 drives the motor 280 to rotate the blades 20 and/or the plurality of wheels 22 in response to a user's actuation of the paddles 26. Depression of the paddles 26 actuates the contactless switch 30. The magnet 42 coupled to the contactless switch 30 rotates with actuation of the contactless switch 30. Rotation of the magnet 42 is sensed by the rotation sensor 159, which outputs a signal to the controller 200 to drive the motor 280, and therefore the blades 20 and/or the plurality of wheels 22. In some embodiments, the controller 200 controls a power switching network 255 (e.g., a FET switching bridge) to drive the motor 280. For example, the power switching network 255 may include a plurality of high side switching elements (e.g., FETs) and a plurality of low side switching elements. The controller 200 may control each FET of the plurality of high side switching elements and the plurality of low side switching elements to drive each phase of the motor 280. When the paddles 26 are released, the controller 200 may apply a braking force to the motor 280. For example, the power switching network 255 may be controlled to more quickly deaccelerate the motor 280. In some embodiments, the controller 200 drives an auxiliary motor to drive the plurality of wheels 22. For example, the motor 280 is controlled to drive the blades 20, and the auxiliary motor is controlled to drive the plurality of wheels 22. The auxiliary motor may be controlled via a second power switching network.

The indicators 245 are also connected to the controller 200 and receive control signals from the controller 200 to turn on and off or otherwise convey information based on different states of the lawnmower 10. The indicators 245 include, for example, one or more light-emitting diodes (LEDs), or a display screen. The indicators 245 can be configured to display conditions of, or information associated with, the lawnmower 10.

The battery pack interface 110 is connected to the controller 200 and is configured to couple with the battery pack 100. The battery pack interface 110 includes a combination of mechanical (e.g., a battery pack receiving portion) and electrical components configured to and operable for interfacing (e.g., mechanically, electrically, and communicatively connecting) the lawnmower 10 with the battery pack 100. The battery pack interface 110 is coupled to the power input unit 260. The battery pack interface 110 transmits the power received from the battery pack 100 to the power input unit 260. The power input unit 260 includes active and/or passive components (e.g., voltage step-down controllers, voltage converters, rectifiers, filters, etc.) to regulate or control the power received through the battery pack interface 110 and to the controller 200. In some embodiments, the battery pack interface 110 is also coupled to the power switching network 255. The operation of the power switching network 255, as controlled by the controller 200, determines how power is supplied to the motor 280.

Figure 14:
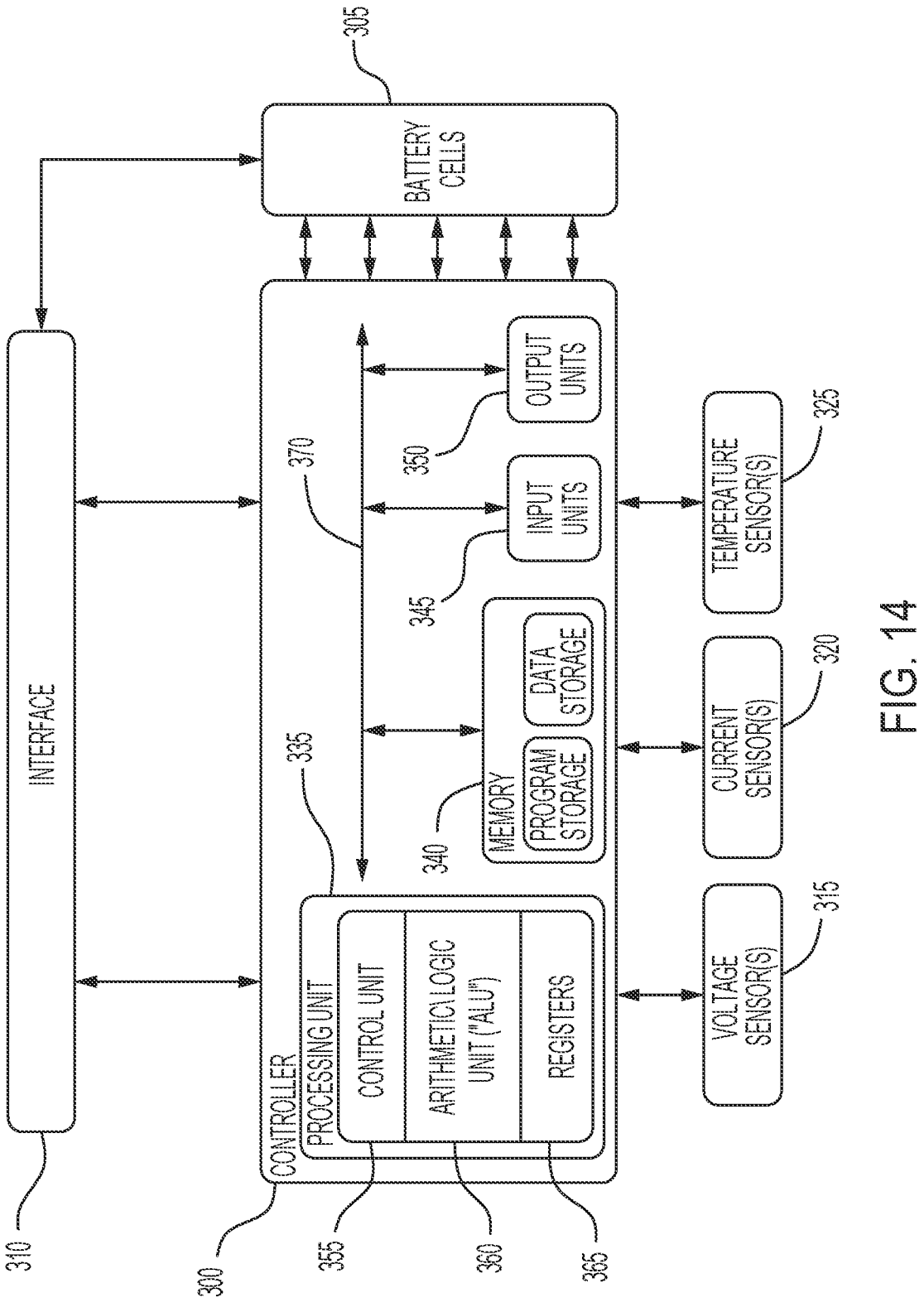
FIG. 14 is a block diagram of a control system for the battery pack of FIG. 12, according to some embodiments.

FIG. 14 illustrates a control system for the battery pack 100. The control system includes a controller 300. The controller 300 is electrically and/or communicatively connected to a variety of modules or components of the battery pack 100. For example, the illustrated controller 300 is connected to one or more battery cells 305 and an interface 310 (e.g., the interface portion 110 of the battery pack 100 illustrated in FIG. 12). The controller 300 is also connected to one or more voltage sensors or voltage sensing circuits 315, one or more current sensors or current sensing circuit 320, and one or more temperature sensors or temperature sensing circuits 325. The controller 300 includes combinations of hardware and software that are operable to, among other things, control the operation of the battery pack 100, monitor a condition of the battery pack 100, enable or disable charging of the battery pack 100, enable or disable discharging of the battery pack 100, etc.

The controller 300 includes a plurality of electrical and electronic components that provide power, operational control, and protection to the components and modules within the controller 300 and/or the battery pack 100. For example, the controller 200 includes, among other things, a processing unit 335 (e.g., a microprocessor, a microcontroller, or another suitable programmable device), a memory 340, input units 345, and output units 350. The processing unit 335 includes, among other things, a control unit 355, an arithmetic logic unit ("ALU") 360, and a plurality of registers 365 (shown as a group of registers in FIG. 14), and is implemented using a known computer architecture (e.g., a modified Harvard architecture, a von Neumann architecture, etc.). The processing unit 335, the memory 340, the input units 345, and the output units 350, as well as the various modules or circuits connected to the controller 200, are connected by one or more control and/or data buses (e.g., common bus 370). The control and/or data buses are shown generally in FIG. 14 for illustrative purposes. The use of one or more control and/or data buses for the interconnection between and communication among the various modules, circuits, and components would be known to a person skilled in the art in view of the invention described herein.

The memory 340 is a non-transitory computer readable medium and includes, for example, a program storage area and a data storage area. The program storage area and the data storage area can include combinations of different types of memory, such as a ROM, a RAM (e.g., DRAM, SDRAM, etc.), EEPROM, flash memory, a hard disk, an SD card, or other suitable magnetic, optical, physical, or electronic memory devices. The processing unit 335 is connected to the memory 340 and executes software instructions that are capable of being stored in a RAM of the memory 340 (e.g., during execution), a ROM of the memory 340 (e.g., on a generally permanent basis), or another non-transitory computer readable medium such as another memory or a disc. Software included in the implementation of the battery pack 100 can be stored in the memory 340 of the controller 200. The software includes, for example, firmware, one or more applications, program data, filters, rules, one or more program modules, and other executable instructions. The controller 300 is configured to retrieve from the memory 340 and execute, among other things, instructions related to the control processes and methods described herein. In other constructions, the controller 300 includes additional, fewer, or different components.

The interface 310 includes a combination of mechanical components (e.g., rails, grooves, latches, etc.) and electrical components (e.g., one or more terminals) configured to and operable for interfacing (e.g., mechanically, electrically, and communicatively connecting) the battery pack 100 with another device (e.g., a power tool, a battery pack charger, the lawnmower 10, etc.). For example, the interface 310 is configured to receive power via a power line between the one or more battery cells 305 and the interface 310. The interface 310 is also configured to communicatively connect to the controller 300.

Figure 15:
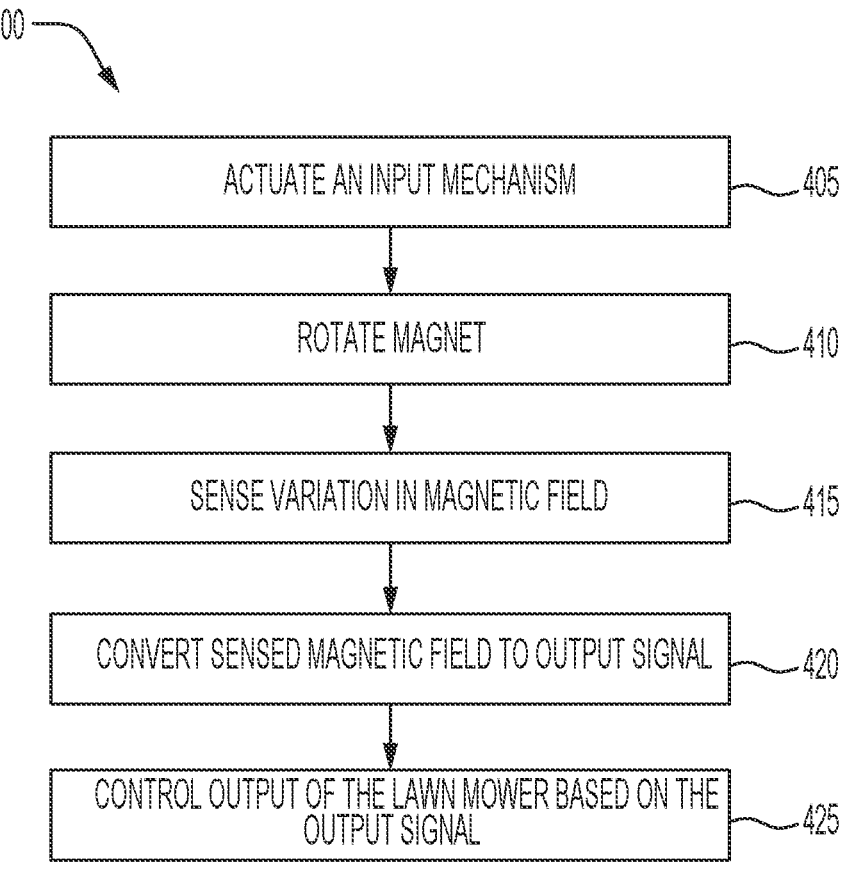
FIG. 15 is a block diagram of a method performed by the controller of FIG. 13, according to some embodiments.

FIG. 15 provides a method 400 for controlling the output of the lawnmower 10, according to some embodiments. At block 405, an input switch of the lawnmower 10 is actuated. For example, the paddles 26 are actuated, thereby rotating the contactless switch 30. At block 410, the magnet 42 rotates. For example, rotation of the contactless switch 30 results in rotation of the magnet 42.

At block 415, the rotation sensor 159 sensor detects variation in a magnetic field generated by the rotating magnet 42. In one embodiment, the rotation sensor 159 is a rotational Hall-effect magnetic sensor. The rotation sensor 159 may be configured to detect a change in a magnetic flux density component, which results from the rotation of the magnet. At block 420, the rotation sensor 159 converts the sensed magnetic field to an output signal, which may be provided to a controller, such as controller 200, as described above. In some embodiments, the rotation sensor 159 is an analog sensor. In some embodiments, the output of the rotation sensor 159 is a voltage that varies linearly with the rotation of the magnet 42. However, in other examples, the output may be a non-linear output, such as a stepped output, a logarithmic output, etc.

At block 425, the controller 300, upon receiving the output of the rotation sensor 159, controls the motor 280 based on the received sensor output. For example, the controller 300 receives the output from the rotation sensor 159 and drives the motor 280 by controlling the power switching network 255 based on the output from the rotation sensor 159, as described above. In some embodiments, the controller 300 controls the output of the auxiliary motor based on the received sensor output.

In some embodiments, in block 415, the rotation sensor 159 is a digital magnetic sensor senses the variation in the magnetic field in addition to or instead of the analog sensor. In these embodiments, the digital magnetic sensors convert the sensed magnetic field to a digital output.

Thus, embodiments described herein provide, among other things, a lawnmower including a contactless switch assembly. Various features and advantages are set forth in the following claims.

What is claimed is:

1. A lawnmower comprising:
a lawnmower housing;
one or more cutting blades;
a motor configured to rotate the one or more cutting blades;
a handle including a switch assembly, the switch assembly including a contactless switch pivotable about an axis point and a magnet located at the axis point;
one or more paddles extending from the handle, wherein rotation of the one or more paddles causes the contactless switch to pivot about the axis point;
a sensor configured to sense a variation of a magnetic field of the magnet; and
a controller coupled to the motor and the sensor, the controller configured to:
receive, from the sensor, a value associated with the variation of the magnetic field of the magnet; and
control the motor based on the value of the variation of the magnetic field.

2. The lawnmower of claim 1, wherein the contactless switch is bound by a first protrusion and a second protrusion.

3. The lawnmower of claim 1, wherein:
the switch assembly further includes an upper housing, a lower housing and a rotator;
the magnet is situated within the rotator; and
the rotator is coupled to the contactless switch through the upper housing.

4. The lawnmower of claim 3, wherein the switch assembly further includes a printed circuit board configured to be coupled to the upper housing via a snap assembly.

5. The lawnmower of claim 3, wherein the lower housing is configured to couple to the upper housing via clamps.

6. The lawnmower of claim 3, wherein:
the switch assembly further includes a printed circuit board; and
the printed circuit board, the magnet, and the contactless switch are configured to be coupled to the lower housing.

7. The lawnmower of claim 1, further including:
a battery pack interface configured to couple with a battery pack.

8. The lawnmower of claim 1, further including:

an auxiliary motor configured to drive one or more wheels.

9. The lawnmower of claim 1, wherein the sensor is further configured to convert the variation of the magnetic field of the magnet to an output signal.

10. A method for driving a lawnmower, the method comprising:

detecting, with a sensor, a variation in a magnetic field from a rotation of a magnet, the rotation of the magnet in response to pivoting of a contactless switch about an axis point, the magnet located at the axis point;

converting, with the sensor, the variation in the magnetic field to an output signal;

providing, with the sensor, the output signal to a controller; and controlling, with the controller, a motor of the lawnmower based on the output signal to rotate one or more cutting blades.

11. The method of claim 10, wherein:

the sensor is an analog sensor; and the output signal is a voltage that varies linearly with the rotation of the magnet.

12. The method of claim 10, wherein controlling the motor of the lawnmower based on the output signal further includes:

controlling, with the controller, a power switching network based on the output signal, wherein the power switching network includes a plurality of high side switching elements and a plurality of low side switching elements.

13. The method of claim 10, wherein the method further includes:

controlling, with the controller, an auxiliary motor of the lawnmower based on the output signal to drive one or more wheels.

14. A contactless switch assembly for a lawnmower, the contactless switch assembly comprising:

an upper housing;

a lower housing configured to couple to the upper housing to form a switch assembly housing;

a contactless switch pivotable about an axis point, the contactless switch external to the switch assembly housing, wherein the contactless switch extends from the axis point to an upper portion;

one or more paddles coupled to the upper portion of the contactless switch, the one or more paddles configured to be rotated to pivot the contactless switch about the axis point;

a magnet located at the axis point, the magnet configured to be rotated when the one or more paddles is rotated to pivot the contactless switch about the axis point; and a sensor configured to sense a variation of a magnetic field of the magnet.

15. The contactless switch assembly of claim 14, wherein the contactless switch is rotated between a first protrusion and a second protrusion extending from the upper housing.

16. The contactless switch assembly of claim 14, wherein the switch assembly further includes a printed circuit board coupled to the upper housing via a snap assembly.

17. The contactless switch assembly of claim 16, wherein the printed circuit board extrudes from the upper housing and the lower housing.

18. The contactless switch assembly of claim 14, wherein:

the switch assembly further includes a printed circuit board; and the printed circuit board, the magnet, and the contactless switch are coupled to the lower housing.

19. The contactless switch assembly of claim 14, wherein the contactless switch assembly is configured to be integrated into a handle of the lawnmower.

20. The contactless switch assembly of claim 14, wherein:

the switch assembly further includes a printed circuit board;

the magnet is coupled between the printed circuit board and the contactless switch; and the printed circuit board is internal to the switch assembly housing.

* * * * *